United States Patent [19]

Kitagawa

[11] Patent Number: 5,097,885
[45] Date of Patent: Mar. 24, 1992

[54] APERTURE COVER FOR BLOCKING ELECTROMAGNETIC RADIATION

[75] Inventor: Hiroji Kitagawa, Nagoya, Japan

[73] Assignee: Kitagawa Industries Company, Aichi, Japan

[21] Appl. No.: 765,494

[22] Filed: Sep. 26, 1991

Related U.S. Application Data

[63] Continuation of Ser. No. 398,937, Aug. 28, 1989, abandoned.

[30] Foreign Application Priority Data

Sep. 17, 1988 [JP] Japan .................................. 63-233062

[51] Int. Cl.⁵ .............................................. A47G 5/02
[52] U.S. Cl. .................................... 160/84.1; 160/238; 361/424; 455/300
[58] Field of Search ............. 160/238, 268.1, DIG. 7, 160/84.1, 314; 174/35 R, 35 MS; 361/424; 455/300, 301

[56] References Cited

U.S. PATENT DOCUMENTS

| | | | |
|---|---|---|---|
| 4,391,865 | 7/1983 | Constance | 160/DIG. 7 |
| 4,408,255 | 10/1983 | Adkins | 174/35 MS X |
| 4,633,322 | 12/1986 | Fourny | 174/35 MS X |
| 4,982,053 | 1/1991 | Thornley et al. | 174/35 MS X |

FOREIGN PATENT DOCUMENTS

509797  2/1938  United Kingdom .

*Primary Examiner*—Blair M. Johnson
*Attorney, Agent, or Firm*—Oliff & Berridge

[57] ABSTRACT

An aperture covering, such as a window shade, comprises a shade body (10), a shielding member (24) provided on a shade-body periphery facing a window frame (2), and a shade-body winding mechanism (6). The shielding member (24) is conductive and contacts the window frame (2) to close the space between the shade body (10) and the window frame (2). When the winding mechanism (6) winds the shade body (10) down to cover the window frame (2) with the shade body (10), the window shade blocks electromagnetic energy inside and outside a building, while regulating light entering the building through a window.

15 Claims, 2 Drawing Sheets

APERTURE COVER FOR BLOCKING ELECTROMAGNETIC RADIATION

This is a continuation of application Ser. No. 07/398,937 filed Aug. 28, 1989, now abandoned.

BACKGROUND OF THE INVENTION

This invention relates to an aperture cover, such as a window shade, that adjusts light coming through a window in a building and functions as an electromagnetic shield.

Recently, office automation has become highly sophisticated. For example, communication equipment in offices use radio wave. To prevent radio noise from leaking into and out of the offices, an electromagnetic shield is required. A prior-art window blind that was proposed in the Japan Published Unexamined Patent Application No. S62-112889 effectively regulates light through a window and functions as the electromagnetic shield for an "intelligent building". In the prior-art window blind, slats connect to each other through transparent films, and electromagnetic shielding material is used for the slats and the transparent films.

However, since the prior-art window blind has clearance between the window frame and the blind and between the slats and the transparent films, electromagnetic energy is not sufficiently shielded. Radio waves easily leak into and out of the building, causing malfunctions of automated office equipment in the building.

SUMMARY OF THE INVENTION

One object of this invention is to solve these problems by providing an aperture cover, such as a window shade, having superior electromagnetic-shielding effects.

This object is achieved by this invention, which provides the window shade for regulating light entering through a window by winding a shade body consisting of an electromagnetic shielding material up and down. The shade body is characterized by a strip of a conductive shielding member being provided on the periphery of the shade body, which periphery faces a window frame, and closing a clearance between the window frame and the shade body.

DESCRIPTION OF THE PREFERRED EMBODIMENTS

Figure 1:
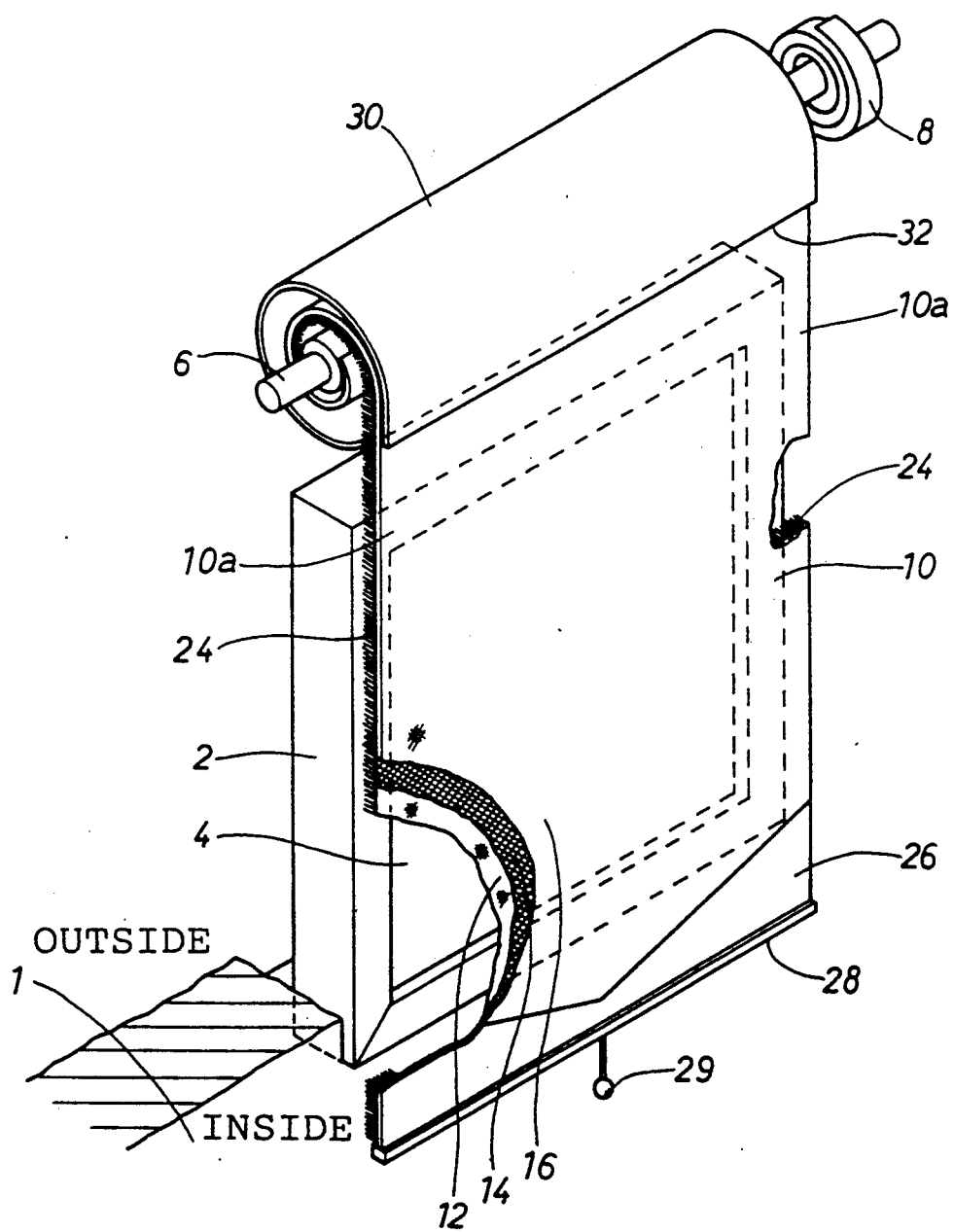
FIG. 1 is a perspective view of a first embodiment of the present invention.
Figure 2:
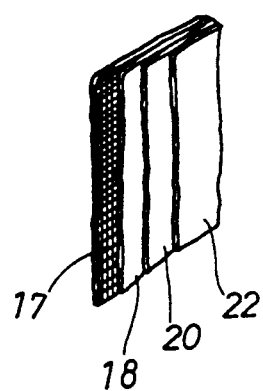
FIG. 2 shows some alternative window shade body materials for the first embodiment.

The first embodiment is explained referring to FIGS. 1 and 2. A pane of glass 4 is set in a window frame 2 in a wall 1. A winding shaft 6 is rotatably supported above and along the frame 2. One end of a flat spiral spring 8 is attached into one end of a winding shaft 6, and the other end of the spring 8 is fixed on the wall 1.

One end of a shade body 10 is fixed to the winding shaft 6, which winds the shade body 10 up and down. The shade body 10 is a lamination of cloth 12, conductive mesh 14, and more cloth 16. The conductive mesh 14, which shields electromagnetic waves in a fixed range of frequencies, can consist of a mesh layer with a single mesh number, or can consist of several mesh layers with various mesh numbers. As shown in FIG. 2, the shade body 10 can be made up of mesh 17, conductive film 18, aluminum foil 20, and copper foil 22 in layers. Alternatively, the shade body 10 can be non woven cloth, for example fibers adhering to each other, that contain conductive particles.

The shade body 10 has a fixed length and width of conductive carbon brush 24 on the periphery 10a of the shade body 10 facing the window frame 2. The carbon brush 24 comprises at least one flexible conductive filament (not shown) that conducts electricity to the mesh 14, and contacts the window frame 2. The shade body 10 has a resilient member 26 at its edge, and the resilient member 26 has a bar 28 at its edge. The bar 28 has a handle 29 in its center. The winding shaft 6 is covered with a cylindrical cap 30. The shade body 10 is pulled down from an opening 32 in the cap 30.

In operation, the handle 29 is pulled to draw the resilient member 26 and the shade body 10 from the cap 30. As the winding shaft 6 rotates, the spring 8 is forced to wind, producing force for rotating the winding shaft 6 back. The shade body 10 is pulled down to cover the window frame 2, and the bar 28 is engaged with an engaging portion (not shown) on the window frame 2. The spring 8 pulls the shade body 10 up toward the winding shaft 6, and at the same time the resilient member 26 holds the shade body 10 down. The shade body 10 is thus kept stretched. By contacting the window frame 2, the carbon brush 24 eliminates the open space between the window frame 2 and the shade body 10.

Consequently, the shade body 10 regulates incoming light, and the mesh 14 in the shade body 10 reflects and absorbs electromagnetic energy produced inside a building. Since the carbon brush 24 reflects and absorbs electromagnetic energy between the periphery 10a and the window frame 2, electromagnetic energy is prevented from leaking through the window out of the building. In the same way, the shade body 10 and the carbon brush 24 reflect and absorb the electromagnetic energy from outside the building, preventing it from entering the building. The electromagnetic energy from inside and outside the building is thus blocked.

Figure 3:
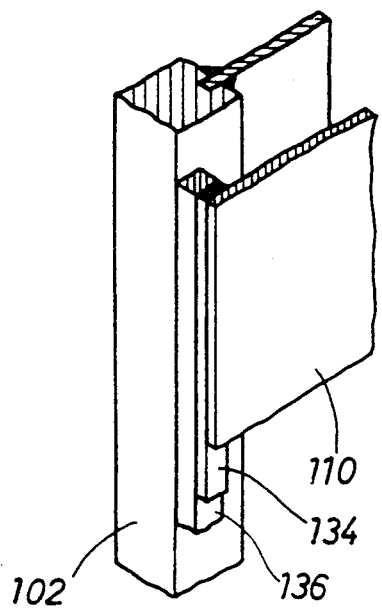
FIG. 3 is a partial illustration of a second embodiment.

The second embodiment is explained referring to FIG. 3. Instead of the carbon brush 24 for the first embodiment, a shade body 110 has a plastic magnet 134 as a flexible sealing material on its periphery. A magnetic guide rail 136 is attached to a window frame 102. In operation, when the shade body 110 is pulled down, the plastic magnet 134 sticks to the guide rail 136 on the window frame 102, closing the space between the window frame 102 and the shade body 110. The shade body 110 thus prevents electromagnetic energy from passing through the window into and out of the building.

Figure 4:
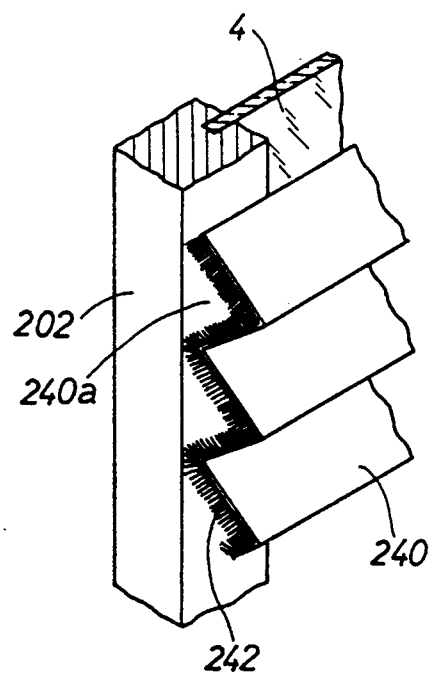
FIG. 4 is a partial illustration of a third embodiment.

The third embodiment is explained referring to FIG. 4. Unlike the first and second embodiments, the third embodiment has a pleated shade body 240. The shade body 240 has a carbon brush 242 on its periphery. The longer the carbon brush 242 is, the more shielding it offers. In operation, when the shade body 240 is pulled down to cover the window, the carbon brush 242 contacts a window frame 202. At the intersection of bellows 240a of the shade body 240, the bristles of the carbon brush 242 contact each other and close the space between the window frame 202 and the shade body 240, preventing electromagnetic energy from leaking in or out.

Figure 5:
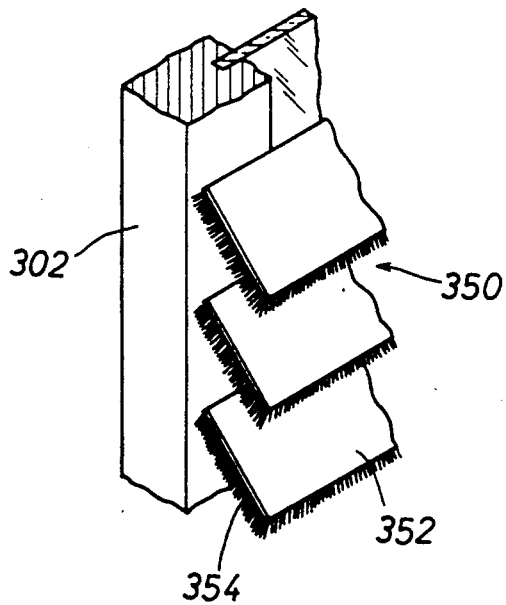
FIG. 5 is a partial illustration of a fourth embodiment.

The fourth embodiment is explained referring to FIG. 5. A shade body 350 consists of slats 352 having a strip of carbon brush 354. In operation, the slats 352 close and form a blind for regulating light. The bristles of the carbon brush 354 contact each other, and close the spaces between the slats 352 and the space between a window frame 302 and the shade body 350. The shade body 350 thus prevents electromagnetic energy from leaking in or out.

In the embodiments, the shade is used for a window. However, the shade could be used at any entrance, exit, or other openings in the building to prevent leakage of electromagnetic energy.

Although specific embodiments of the invention have been shown and described for the purpose of illustration, the invention is not limited to the embodiments illustrated and described. This invention includes all embodiments and modifications that come within the scope of the claims.

What is claimed is:

1. At least one covering for an aperture for regulating light, comprising:
    electromagnetic shielding material comprising at least two electrically conductive layers with different shielding properties;
    said material defining at least one generally planar surface;
    additional shielding material on the periphery of the covering that fills a gap between the covering extending generally orthogonally away from said at least one generally planar surface and the aperture when the covering is in use, where the additional shielding material is electrically connected with the electromagnetic shielding material.

2. A covering as in claim 1 in which the additional shielding material is magnetic.

3. A covering as in claim 1 in which the additional shielding material magnetically fastens to the periphery of the aperture.

4. A covering as in claim 1 in which the covering is pleated, and the additional shielding material largely fills at least one gap between at least two pleats of the covering.

5. A covering as in claim 1 in which the covering comprises at least two pieces, and
    the additional shielding material largely fills at least one gap between at least two of the pieces.

6. The at least one covering according to claim 1, wherein the at least two conductive layers comprise conductive mesh, conductive film, aluminum foil, and copper foil.

7. The at least one covering according to claim 1, wherein the covering is non-woven cloth which includes fibers adhering to each other that contain conductive particles.

8. A window shade for regulating light entering through a window by raising and lowering a shade body, comprising:
    an electromagnetic shielding material, comprising at least two electrically conductive layers with different shielding properties;
    said material defining at least one generally planar surface;
    a strip of shielding material on the periphery of the shade body, which extends generally orthogonally away from said at least one generally planar surface which periphery faces a window frame, where the strip of shielding material closes a clearance between the window frame and the shade body, when in use the strip of shielding material being electrically connected with the electromagnetic shielding material.

9. A window shade as in claim 8 in which the strip of shielding material is magnetic.

10. A window shade as in claim 9 in which the strip of shielding material magnetically fastens to a guide rail on the window frame.

11. A window shade as in claim 8 in which the window shade is pleated, and the strip of shielding material largely fills at least one gap between at least two pleats of the window shade.

12. A window shade as in claim 8 in which the window shade comprises at least two pieces, and the strip of shielding material largely fills at least one gap between at least two of the pieces.

13. The window shade according to claim 8, wherein the at least two conductive layers comprise conductive mesh, conductive film, aluminum foil, and copper foil.

14. The window shade according to claim 8, wherein the shade body is non-woven cloth which includes fibers adhering to each other that contain conductive particles.

15. The window shade according to claim 8, wherein the strip of shielding material is a conductive carbon brush.

* * * * *